United States Patent
Woida-O'Brien

(10) Patent No.: US 10,395,800 B2
(45) Date of Patent: Aug. 27, 2019

(54) METHOD OF MANUFACTURING AN ELECTRICAL CABLE USING 3-D PRINTING

(71) Applicant: Raytheon Company, Waltham, MA (US)

(72) Inventor: Rigel Q. Woida-O'Brien, Tucson, AZ (US)

(73) Assignee: RAYTHEON COMPANY, Waltham, MA (US)

(*) Notice: Subject to any disclaimer, the term of this patent is extended or adjusted under 35 U.S.C. 154(b) by 0 days.

(21) Appl. No.: 15/794,656

(22) Filed: Oct. 26, 2017

(65) Prior Publication Data
US 2018/0061531 A1 Mar. 1, 2018

Related U.S. Application Data

(62) Division of application No. 14/146,356, filed on Jan. 2, 2014, now Pat. No. 9,837,191.

(51) Int. Cl.
*H01B 13/00* (2006.01)
*B29C 64/112* (2017.01)
(Continued)

(52) U.S. Cl.
CPC ............ *H01B 13/00* (2013.01); *B29C 64/112* (2017.08); *B29C 64/386* (2017.08);
(Continued)

(58) Field of Classification Search
CPC . B29C 67/0037; B29C 70/882; B29C 64/112; B29C 64/386; C25D 5/02;
(Continued)

(56) References Cited

U.S. PATENT DOCUMENTS 7,264,617 B2 9/2007 Freeman
8,733,828 B2 5/2014 Vanhouten
(Continued)

FOREIGN PATENT DOCUMENTS

WO WO 2013/010108 A1 * 1/2013

OTHER PUBLICATIONS

International Search Report and Written Opinion; International Application No. PCT/US2014/064474; International Filing Date: Nov. 7, 2014; dated Feb. 20, 2015; 4 pages.
(Continued)

*Primary Examiner* — Carl J Arbes
(74) *Attorney, Agent, or Firm* — Cantor Colburn LLP

(57) ABSTRACT

Embodiments are directed to a method for manufacturing a product comprising: establishing, by a computing device comprising a processor, at least one parameter of a particular instance of a component to be used in the product, adapting, by the computing device, a baseline model of the component based on the at least one parameter to accommodate use of the particular instance of the component, growing a structure based on the adapted model to accommodate the particular instance of the component using an additive manufacturing technique, coupling the structure to the particular instance of the component, growing an electrical harness by using additive printing to establish an electrical cable, and assembling the product by coupling the electrical harness to the particular instance of the component.

12 Claims, 11 Drawing Sheets

(51) Int. Cl.
  *B29C 64/386* (2017.01)
  *B33Y 10/00* (2015.01)
  *B33Y 80/00* (2015.01)
  *B29L 31/00* (2006.01)
  *B29L 31/34* (2006.01)
  *H05K 1/14* (2006.01)

(52) U.S. Cl.
  CPC .............. *B29K 2995/0006* (2013.01); *B29K 2995/0007* (2013.01); *B29L 2031/3462* (2013.01); *B29L 2031/707* (2013.01); *B33Y 10/00* (2014.12); *B33Y 80/00* (2014.12); *H05K 1/147* (2013.01); *H05K 2201/10189* (2013.01)

(58) Field of Classification Search
  CPC ........... C25D 25/00; B29K 2995/0006; B29K 2995/0007; B29L 2031/3462; B29L 2031/707; B33Y 10/00; B33Y 80/00; H01B 13/00; H05K 1/147; H05K 2201/10189
  See application file for complete search history.

(56) References Cited

U.S. PATENT DOCUMENTS

| | | |
|---|---|---|
| 2005/0205136 A1 | 9/2005 | Freeman |
| 2006/0237879 A1 | 10/2006 | Palmer et al. |
| 2010/0148345 A1 | 6/2010 | Eckhardt |
| 2012/0001457 A1 | 1/2012 | Vanhouten |
| 2014/0231266 A1* | 8/2014 | Sherrer ................. B22D 19/00 205/136 |
| 2014/0291886 A1* | 10/2014 | Mark .................... B29C 64/118 264/163 |
| 2015/0117859 A1 | 4/2015 | Backman |
| 2015/0187467 A1 | 7/2015 | Woida-O'Brien |

OTHER PUBLICATIONS

International Preliminary Report on Patentability, dated Jul. 5, 2016; 7 pages.
Weber, "Does 3D printing work with wiring", Assembly Magazine, Oct. 1, 2013, pp. 1-4.

* cited by examiner

METHOD OF MANUFACTURING AN ELECTRICAL CABLE USING 3-D PRINTING

DOMESTIC PRIORITY

This application is a divisional of U.S. patent application Ser. No. 14/146,356, filed Jan. 2, 2014, the disclosure of which is incorporated by reference herein in its entirety.

BACKGROUND

The present disclosure relates to computing technology, and more specifically, to generation of cables, leads, and shielding for purposes of conveying data.

Rapid manufacturing is challenging to achieve without sacrificing quality. In order to reduce cost and manufacturing time, it may be possible to leverage commercial-off-the-shelf (COTS) components, combining such components to enable a new system of capabilities. Such a technique is driven by a concept that low cost and rapid turn is achievable by limiting research and development (R&D) activities, with a focus being placed on integration. However, in a dynamic COTS environment where new products emerge on the order of, e.g., twelve to eighteen months, simply focusing on integration is infeasible and impractical.

SUMMARY

According to one embodiment, a method for manufacturing a product comprises: establishing, by a computing device comprising a processor, at least one parameter of a particular instance of a component to be used in the product, adapting, by the computing device, a baseline model of the component based on the at least one parameter to accommodate use of the particular instance of the component, growing a structure based on the adapted model to accommodate the particular instance of the component using an additive manufacturing technique, coupling the structure to the particular instance of the component, growing an electrical harness by using additive printing to establish an electrical cable, and assembling the product by coupling the electrical harness to the particular instance of the component.

According to another embodiment, a method comprises: establishing connecting pins for an electrical cable by sintering, creating wiring in the cable by using ink printing to connect the pins, wherein at least a portion of the wiring is configured to convey data, creating shielding atop the wiring using ink printing, and creating a mechanical protection and interface for the cable using three-dimensional (3D) printing.

According to another embodiment, an electrical cable comprises: connecting pins established by ether sintering, wiring connecting the pins established by ink printing, wherein at least a portion of the wiring is configured to convey data, shielding atop the wiring established by ink printing, and mechanical protection for the wiring established by three-dimensional (3D) printing.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
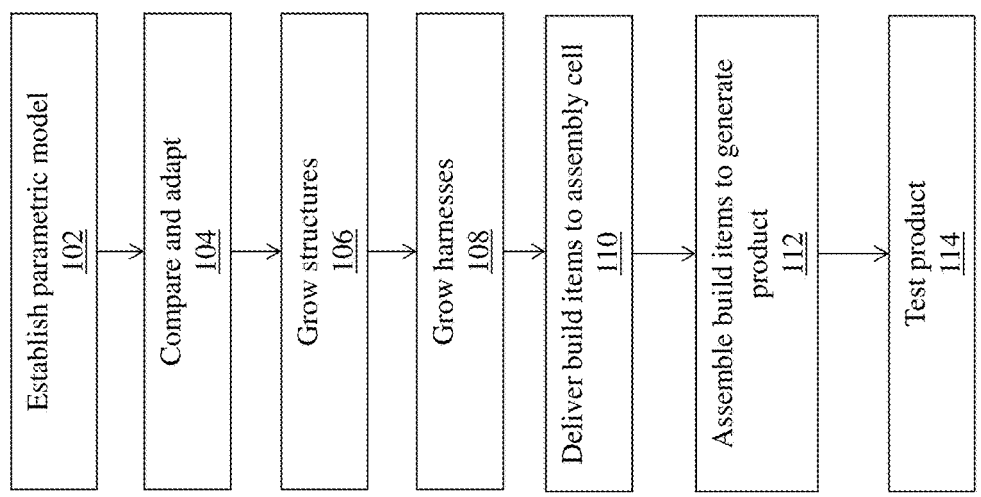
FIG. 1 illustrates a flow chart of an exemplary method.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection.

Exemplary embodiments of apparatuses, systems, and methods are described for creating custom, additive printable cables, leads, and shielding to carry data. In some embodiments, a connector may be additively grown to couple the cable to a device. In some embodiments, a cable or harness may be grown directly on top of a system structure in order to increase robustness and space utilization while reducing flex damage.

Referring to FIG. 1, a flow chart of a method 100 is shown. The method 100 may be used to rapidly manufacture a product with structural and functional integrity, potentially on the basis of one or more components. The product may be targeted to, e.g., a commercial sector, an industrial sector, an aerospace sector, or a military sector.

In block 102, a parametric model may be established. For example, the parametric model may be established for one or more components or devices, such as a COTS component that is to be modified or adapted to support a specified function. As part of block 102, a robotic inspection station may collect data on the three-dimensional (3D) geometry, weight, and center-of-gravity (CG) of the component.

In block 104, a current state of the component, as indicated via the parametric model of block 102, may be compared to a baseline version of the component or model. Digital data may be adapted to create a new custom design to accommodate the component in hand.

In block 106, one or more structures may be grown. Additive manufacturing techniques may be applied in connection with block 106. Thermal management consideration may be applied in block 106. One or more component mounting features or structures may be obtained in block 106.

In block 108, one or more electrical harnesses may be grown. Additive printing may be used to add electrical cabling and connectors. As part of block 108, the harness(es) may be interfaced to the structure(s) of block 106.

In block 110, one or more build items may be delivered to an assembly cell (e.g., a robotic assembly cell). The build items may include one or more of: a housing, structures (e.g., the structures of block 106), a card or circuit board, and optics.

In block 112, the build items may be assembled in the assembly cell to generate the product. Additive components and harnessing may be designed to maximize robotic automation and provide a level of assurance regarding the product.

In block 114, the product may be subjected to one or more tests to validate that the product meets one or more requirements. As part of block 114, any calibration that may be needed may be performed on the product. One or more components may be energized as part of block 114.

As described above, a 3D scanning of an incoming part or component may be performed to identify a previously unknown deviation to a baseline sold model or lot-to-lot variations. A vision system may be used to identify a type of electrical connection needed. In some embodiments, the type of electrical connection may be based on the type of data that is to be supported. For example, a printable additive circuit may be used to carry universal serial bus (USB) (2.0 and 3.0), Ethernet (Cats and Cat6), Firewire (e.g., IEEE 1394), high-definition multimedia interface (HDMI), coax (e.g., cable communications), RS-232, RS-485, and RS-422 data, or any other type of data. Mechanical mounting, electrical interfacing, weight, and CG parameters may be loaded into a database. The database may be accessed to run an automated (re)design of structures and harnessing to create a new system, function, or design that satisfies one or more requirements with parts or components on hand. The new design may be used to additively grow structural components, overlay harnessing, and interface connectors. In this manner, a manufacturing process may be established that adapts to unknown variations in components while incurring little to no delay in the manufacture of a product.

In terms of the type of signals that may be transmitted, harnessing may be established or generated to achieve one or more design requirements. For example, in connection with Ethernet communications, a 1 gigabyte (GB) data connection may be provided with the use of standard or conventional connectors. The Ethernet communications may provide for a minimum of seven inches of data transfer, with potentially up to three feet of reliable data transfer. In connection with USB communications, a USB 3.0 connection may be provided with a type B micro plug. The USB communications may provide for a minimum of seven inches of data transfer, with potentially up to three feet of reliable data transfer. In connection with a transfer of power, at least 3 A of current may be transferred at 12V, with potentially 5 A transferred at 12V. The cited values are illustrative and other values may be used in some embodiments.

Referring to FIGS. 2A-2E, a sequence of figures is shown in connection with a printing process applied to a dielectric and leads in accordance with one or more embodiments. The sequence may proceed such that a second step or layer builds on top of a first step or layer. The sequence of FIGS. 2A-2E may be used to establish a harness or cable.

Figure 2A:
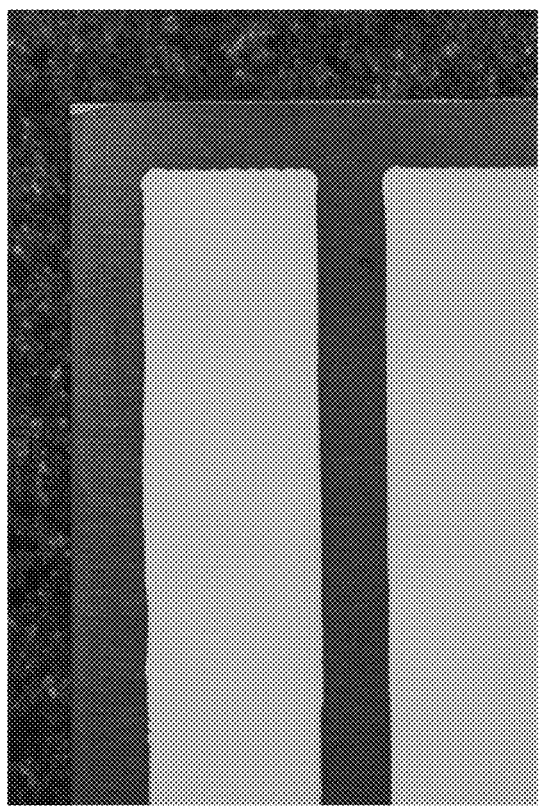
FIGS. 2A-2E, taken together, illustrate an exemplary sequence used to establish a harness or cable.

In FIG. 2A, a (close-up view of a) dielectric base layer 202 is shown. The dielectric layer 202 may adhere to one or more materials, such as aluminum. The dielectric material may tend to spread, which may be desirable to impost a smooth surface after printing.

Figure 2B:
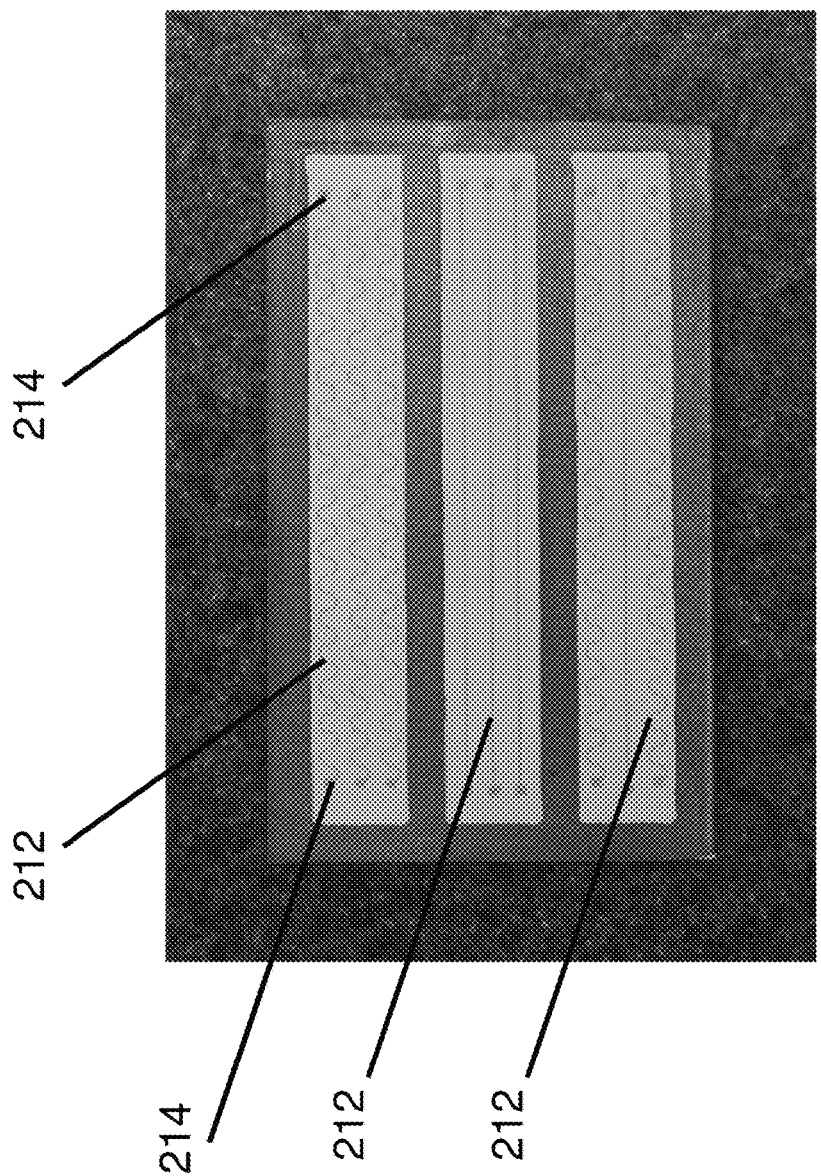

In FIG. 2B, silver may be used to print leads 212 and/or connection points 214. The "squiggly-shaped" leads/lines 212 may represent one design or one-half of a twisted pair.

Figure 2C:
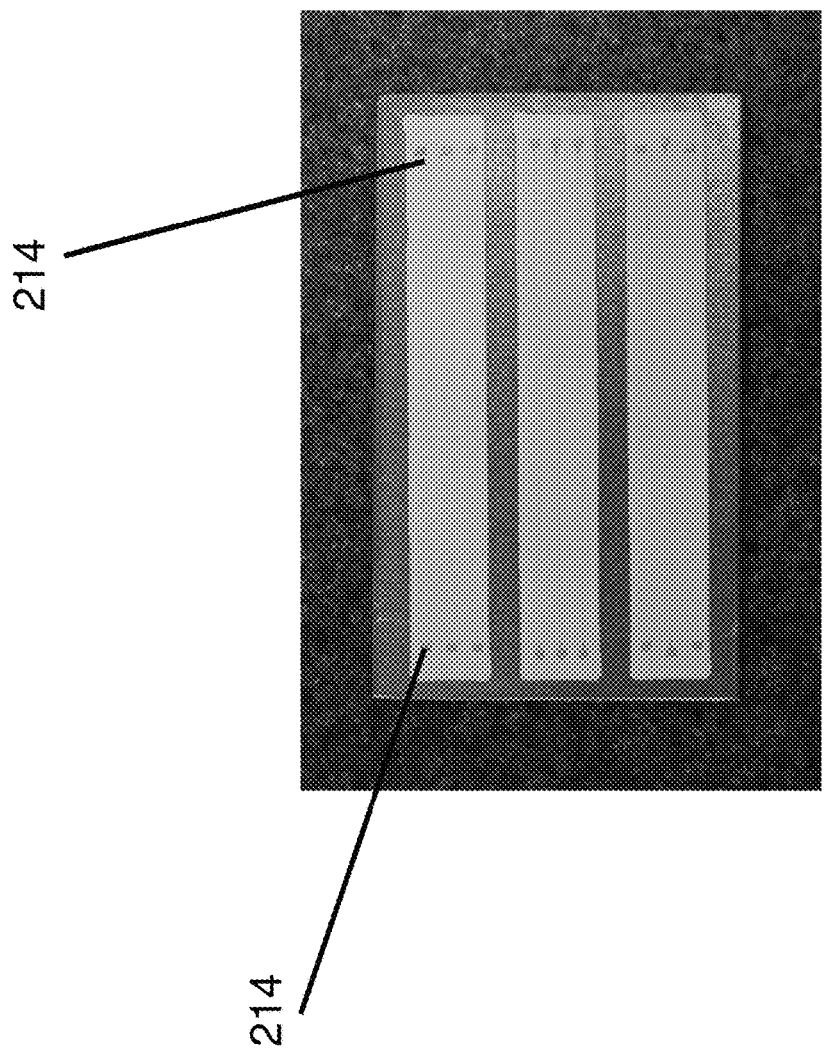

In FIG. 2C, a second layer of dielectric may be applied. The application of the second dielectric layer may generally cover the leads 212, such that the leads 212 are insulated. Following application of the second dielectric layer, the connection points 214 may still be exposed.

Figure 2D:
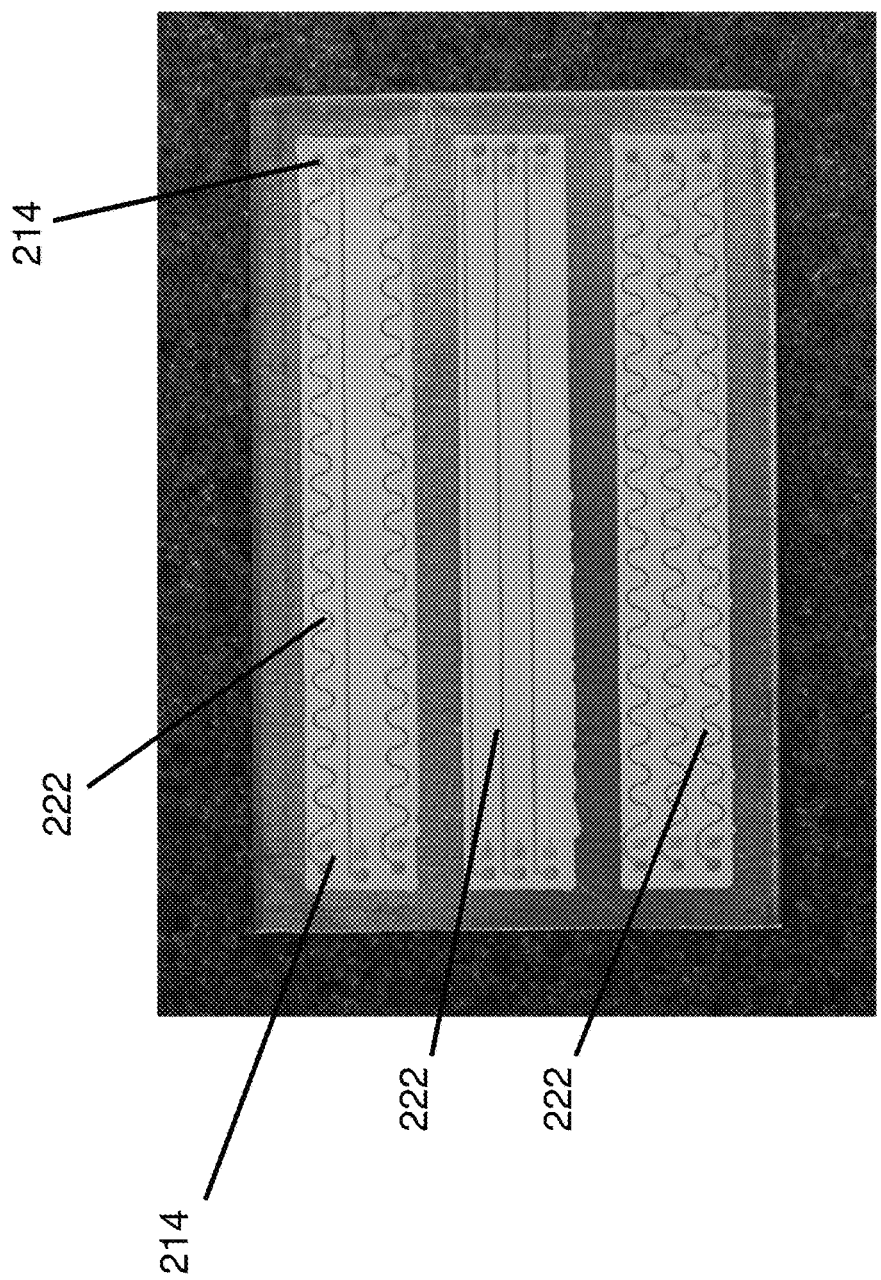

In FIG. 2D, silver may be used to print leads 222. The leads 222 may be substantially similar the leads 212. The "squiggly-shaped" leads 222 may be one-hundred eighty (180) degrees out of phase with respect to the leads 212.

Figure 2E:
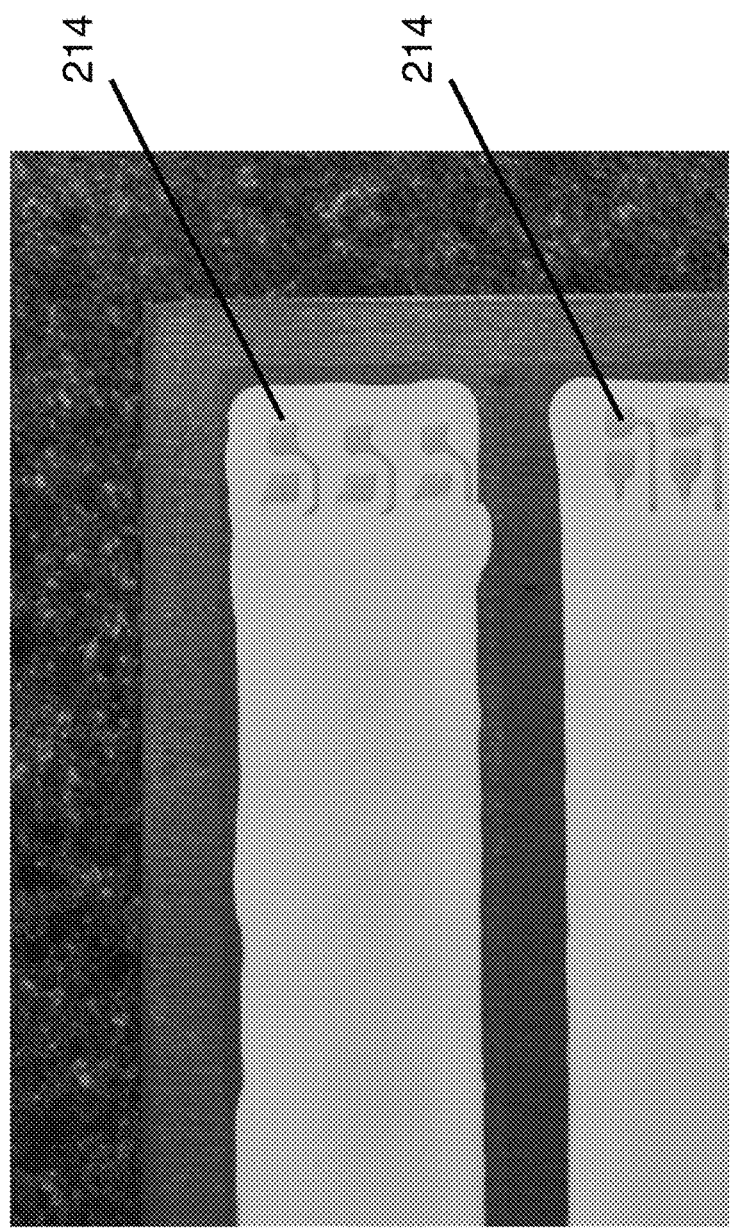

In FIG. 2E, a third layer of dielectric may be applied. As shown in FIG. 2E, the leads 222 may be substantially covered by the third dielectric layer.

As described above, a connector may be grown from a cable or harness to a device. The connector may be designed and fabricated to support a "snap-in" type of connection. The connector may be of a type used to connect "flex pins" to boards. The connector may press into printed pins to create a connection. In some embodiments, a flexible printed connector may be used to connect a printed harness to a short cable with a connector and the board connector for a final connection.

Figure 3A:
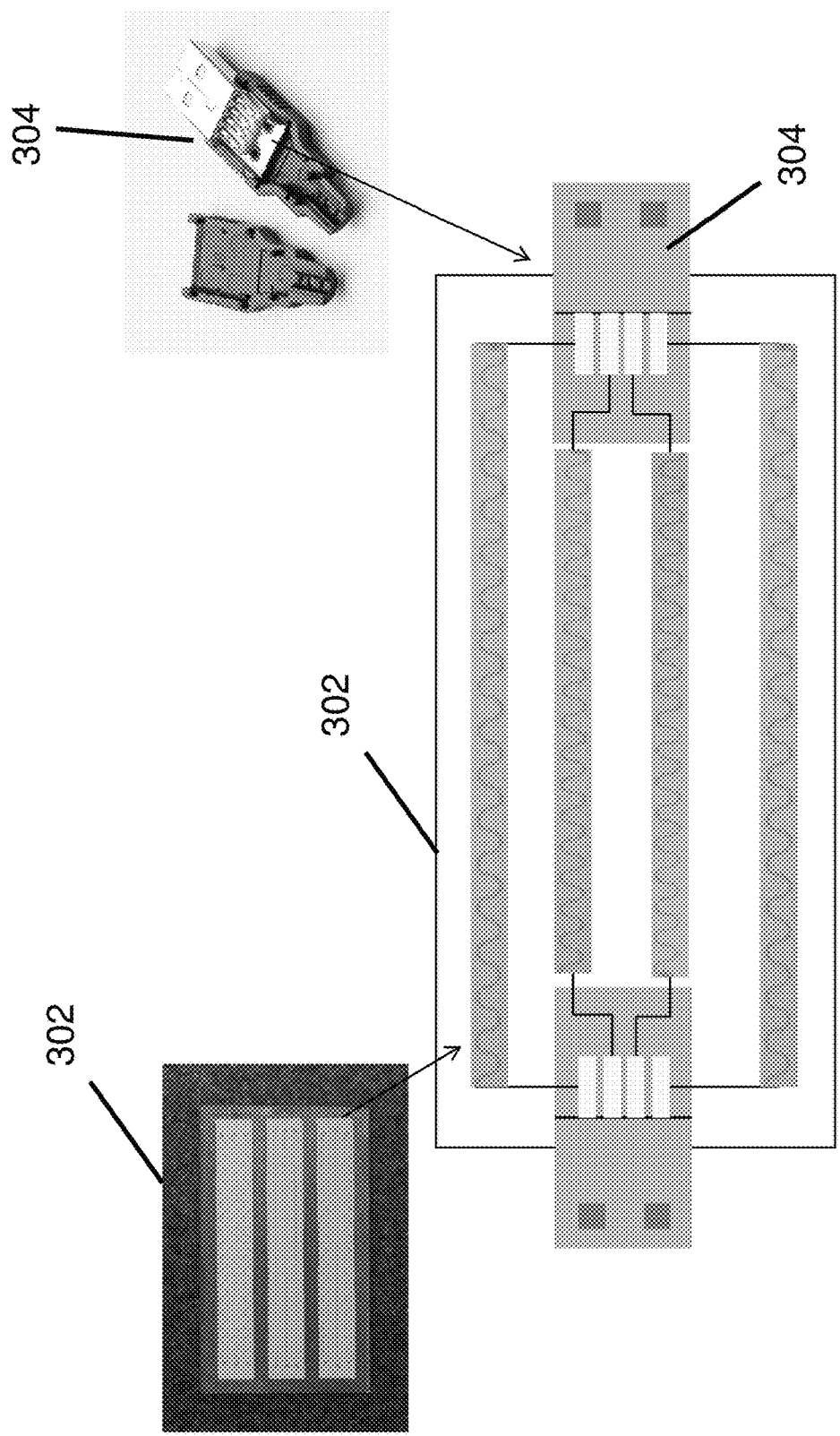
FIG. 3A illustrates a connector mounted to an additive cable in accordance with an exemplary embodiment.
Figure 3B:
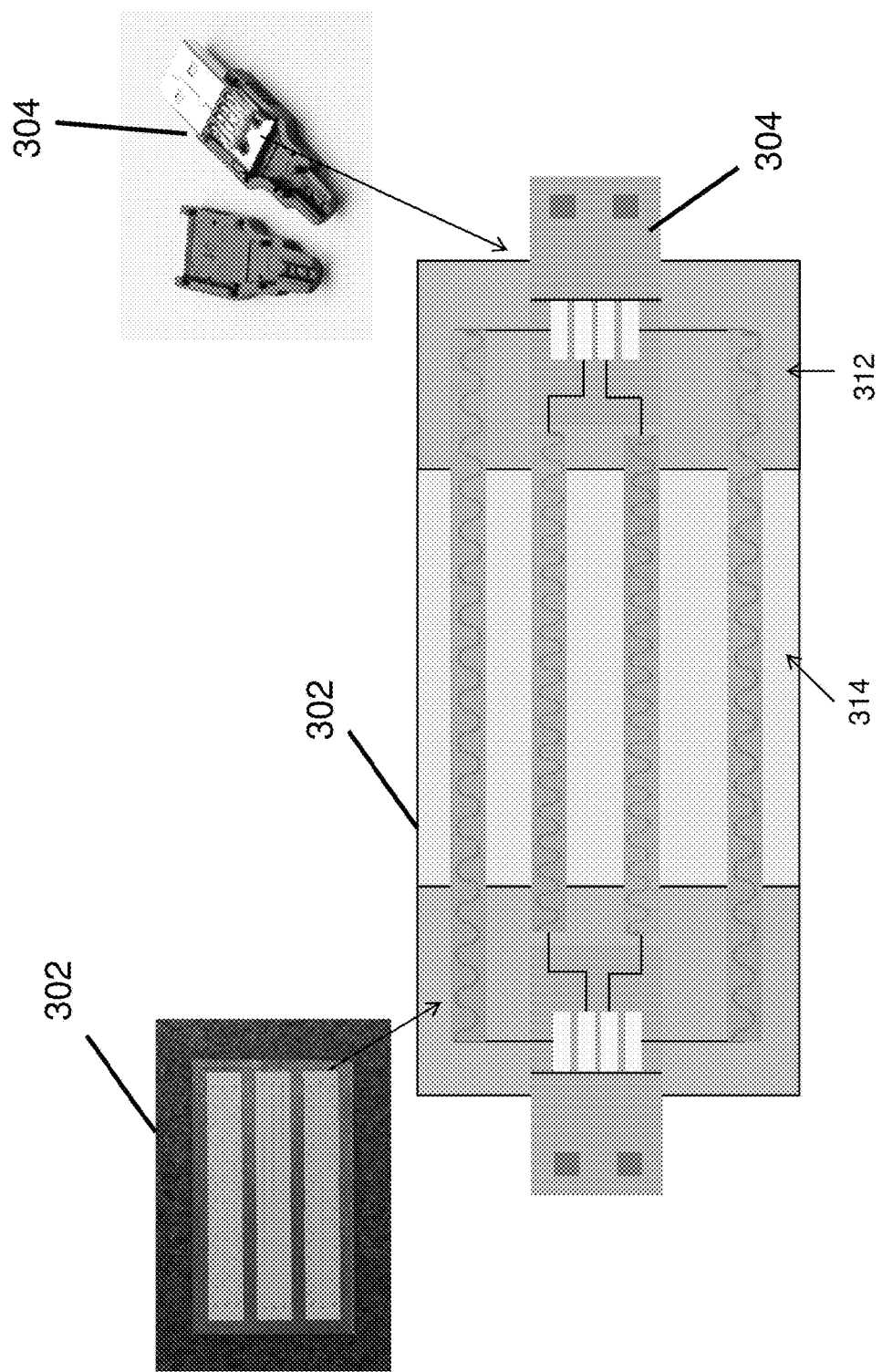
FIG. 3B illustrates a connector mounted to an additive cable in accordance with an exemplary embodiment.

Referring to FIGS. 3A-3B, two embodiments are shown for mounting a USB shell connector with an additive cable (e.g., the cable of FIGS. 2A-2E). In the first embodiment shown in FIG. 3A, which may be referred to as a "hard mount," a USB connector 304 is shown as being applied to a portion of an additive cable 302. Ink may be used to provide the connection between the cable 302 and the connector 304. The second embodiment shown in FIG. 3B may be similar to the embodiment of FIG. 3A, except the cable 302 may include a plastic sheet 312 in combination with a metal plat 314, where the plastic sheet 312 may be used to add flexibility. In this respect, the embodiment of FIG. 3B may be referred to as a "flex mount."

Figure 4:
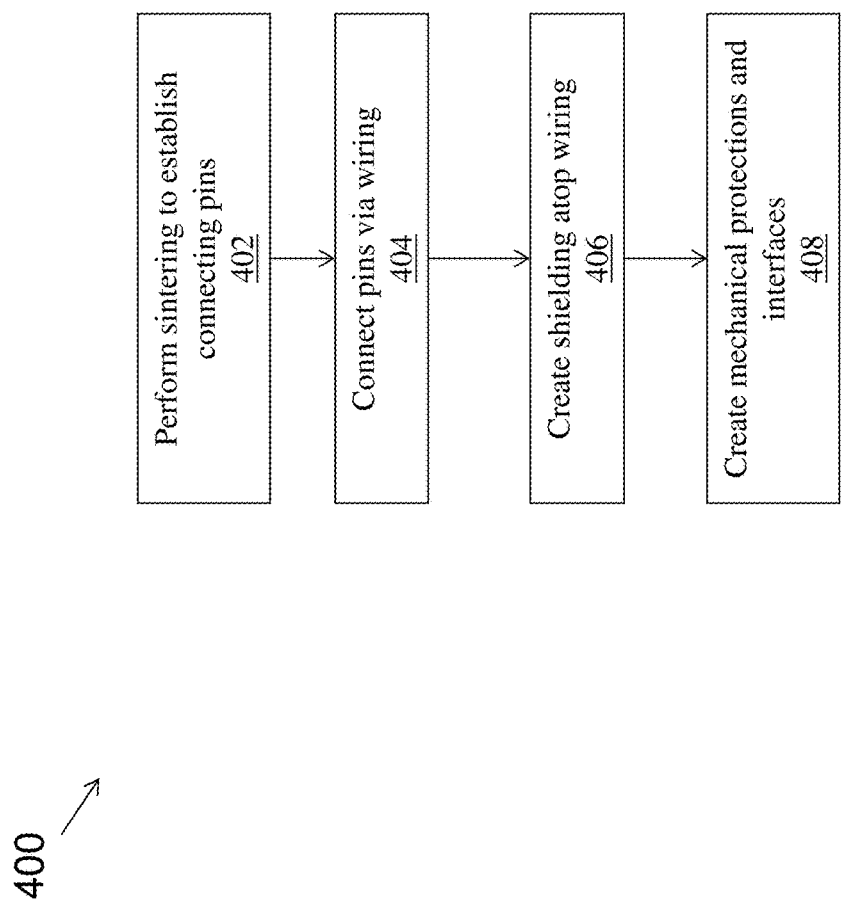
FIG. 4 illustrates a flow chart of an exemplary method.

Referring to FIG. 4, a flow chart of a method 400 is shown. The method 400 may be used to manufacture one or more cables or harnesses, potentially on the basis of additive technology.

In block 402, (ether) sintering of a cable may be performed to establish connecting pins. Alternatively, a pin drop-in may be used in block 402.

In block 404, the pins may be connected using, e.g., ink printing. Ink printing may be used to create long communication wiring in the cable.

In block 406, shielding may be created atop the wiring. Ink printing techniques may be used to create the shielding.

In block 408, mechanical protections and interfaces may be created. One or more materials may be used for the mechanical protections and interfaces, such as one or more metals, plastics, etc. 3D printing techniques may be used in block 408.

Figure 5A:
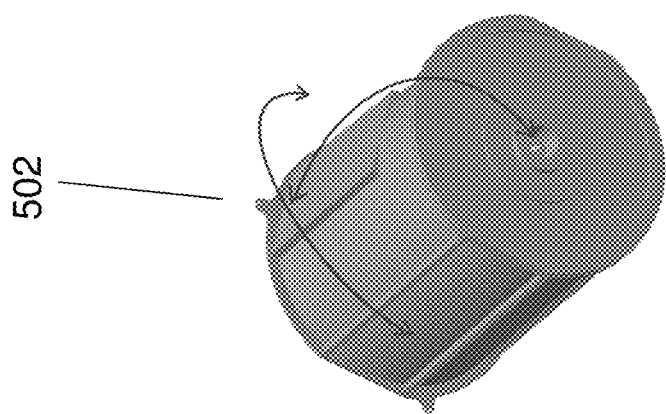
FIGS. 5A-5B illustrate an exemplary product manufactured in accordance with one or more embodiments.
Figure 5B:
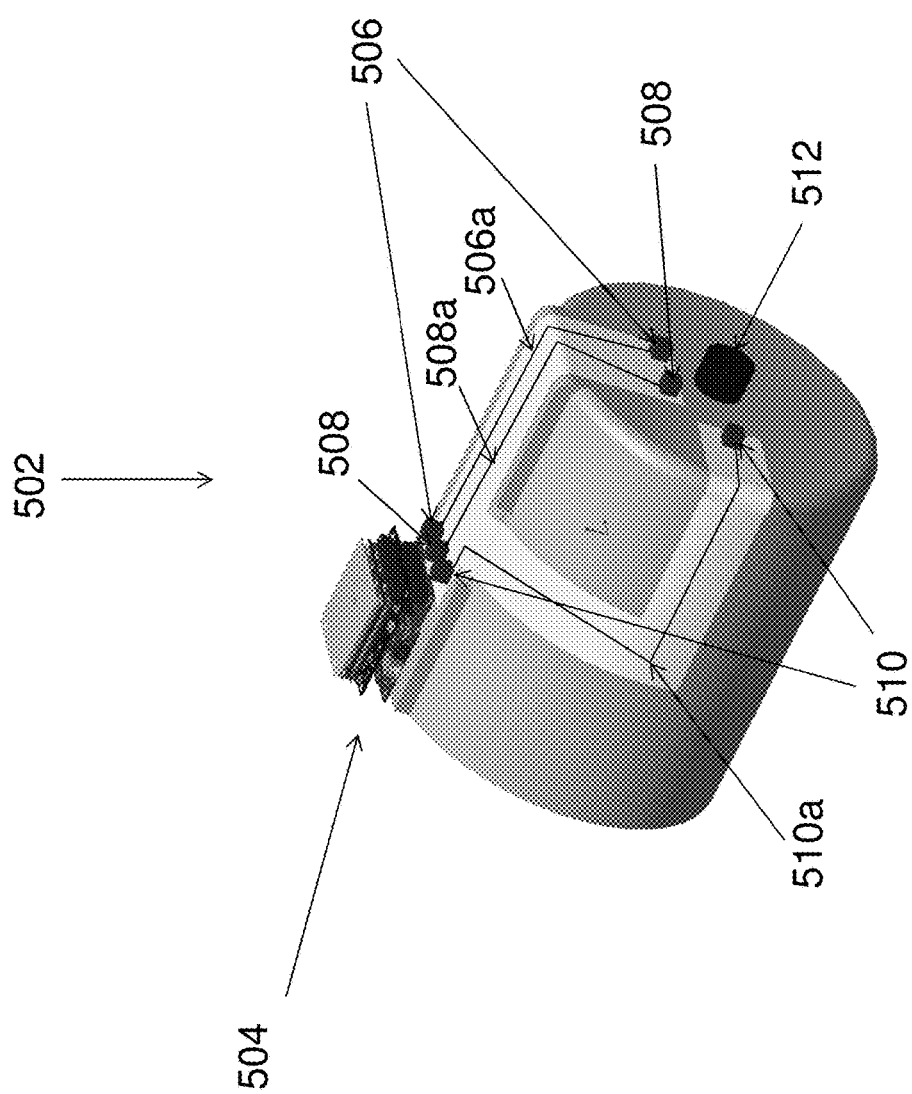

Embodiments of the disclosure may combine aspects of 3D printing, ink jet printing, and laser sintering to accelerate a manufacture of one or more products. As described above, the products may be associated with one or more sectors, such as the commercial sector, the industrial sector, the aerospace sector, or the military sector. An example product is shown in FIGS. 5A-5B. FIG. 5A illustrates a typical sunshade 502 that may be applied to a satellite. The sunshade 502 may include one or more curved surfaces, as reflected via the arrows in FIG. 5A. It may be desirable in some instances to be able to apply cables around the curved surfaces.

In FIG. 5B, the sunshade 502 of FIG. 5A is shown with additional components and devices. Those additional components and devices include electronics 504 (e.g., a battery and computing device), USB 3.0 connector hubs 506, power hubs 508, Ethernet hubs 510, and a camera 512. Also, cables 506a, 508a, and 510a may be provided between the hubs 506, 508, and 510, respectively. The cables 506a, 508a, and 510a may be grown or provided in accordance with one or more of the techniques described herein. The particular components and devices shown in FIGS. 5A-5B are illustrative; other types of components or devices may be used in some applications.

In some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

Embodiments may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A method of manufacturing an electrical cable, the method comprising:
   performing ether sintering to form connecting pins on the electrical cable;
   ink printing conductive wirings to connect the pins, wherein at least a portion of the ink printed conductive wirings is configured to convey data;
   ink printing a shielding atop the ink printed conductive wirings; and
   performing a three-dimensional (3D) printing to form a mechanical protection device that protects the ink printed conductive wirings.

2. The method of claim 1, wherein prior to forming the connecting pins, growing the electrical cable directly on top of a product structure.

3. The method of claim 2, wherein the wiring is configured to support the conveyance of data in accordance with at least one of the following: USB, Ethernet, Firewire, HDMI, Coax, RS-232, RS-485, and RS-422.

4. The method of claim 3, wherein the electrical cable comprises a twisted pair of wires created in a three-dimensional (3D) fashion.

5. A method comprising:
   establishing connecting pins for an electrical cable by sintering;
   creating wiring in the cable by using ink printing to connect the pins, wherein at least a portion of the wiring is configured to convey data;
   creating shielding atop the wiring using ink printing; and
   creating a mechanical protection and interface for the cable using three-dimensional (3D) printing.

6. The method of claim 5, wherein the cable is configured to support a conveyance of data.

7. The method of claim 6, wherein the cable is configured to support the conveyance of data in accordance with at least one of the following: USB, Ethernet, Firewire, HDMI, Coax, RS-232, RS-485, and RS-422.

8. The method of claim 6, wherein the cable comprises a twisted pair of wires created in a three-dimensional (3D) fashion.

9. The method of claim 6, further comprising growing the cable so that the cable is configured to wrap around at least one curved surface associated with a structure.

10. The method of claim 6, further comprising:
    manufacturing the cable to accommodate at least one variation in a parameter associated with a specific instance of a component; and
    coupling the cable to the component.

11. The method of claim 6, further comprising coupling the cable to a connector using pins printed on the cable.

12. The method of claim 6, wherein the cable comprises a plurality of dielectric layers overlaid on top of a plurality of layers of printed silver leads, and wherein at least a first portion of leads included in a first of the layers of leads is one-hundred eighty degrees out of phase with respect to a second portion of leads included in a second of the layers of leads.

* * * * *